United States Patent
Rodnick

(10) Patent No.: US 9,698,035 B2
(45) Date of Patent: Jul. 4, 2017

(54) MICROSTRUCTURES FOR IMPROVED WAFER HANDLING

(71) Applicant: LAM Research Corporation, Fremont, CA (US)

(72) Inventor: Matthew J. Rodnick, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/139,522

(22) Filed: Dec. 23, 2013

(65) Prior Publication Data

US 2015/0174768 A1 Jun. 25, 2015

(51) Int. Cl.
*H01L 21/677* (2006.01)

(52) U.S. Cl.
CPC ...... *H01L 21/677* (2013.01); *H01L 21/67742* (2013.01); *H01L 21/67766* (2013.01); *Y10S 294/902* (2013.01); *Y10S 901/30* (2013.01)

(58) Field of Classification Search
CPC ............. H01L 21/677; H01L 21/67742; H01L 21/67748; H01L 21/67766; H01L 21/683; H01L 21/6831; H01L 21/6833; Y10S 901/30; Y10S 901/39; Y10S 294/902
USPC ............ 294/213, 902; 414/935, 941; 901/39
See application file for complete search history.

(56) References Cited

U.S. PATENT DOCUMENTS

| 6,896,304 | B2* | 5/2005 | Li et al. ................ 294/185 |
| 7,921,858 | B2* | 4/2011 | Autumn et al. .......... 134/137 |
| 2008/0025822 | A1* | 1/2008 | Kim et al. ............ 414/217.1 |
| 2012/0100464 | A1 | 4/2012 | Kageyama |
| 2014/0301818 | A1* | 10/2014 | Gilchrist et al. ........ 414/744.2 |
| 2014/0369802 | A1* | 12/2014 | Sitti et al. ................ 414/800 |

FOREIGN PATENT DOCUMENTS

| GB | 2435719 | * | 9/2007 |
| JP | 2001-223252 | | 8/2001 |
| JP | 2005-183784 | | 7/2005 |
| JP | 2009530838 | | 8/2009 |
| JP | 2012089837 | | 5/2012 |
| WO | WO 2007/107885 | | 9/2007 |
| WO | 2013/090898 | | 6/2013 |

OTHER PUBLICATIONS

Aksak, et al. "Gecko Inspired Micro-Fibrillar Adhesives for Wall Climbing Robots on Micro/Nanoscale Rough Surfaces," ICRA (2008).

(Continued)

*Primary Examiner* — Dean Kramer
(74) *Attorney, Agent, or Firm* — Weaver Austin Villeneuve & Sampson LLP

(57) ABSTRACT

Provided herein are high coefficient of friction contact surfaces for transfer of substrates including semiconductor wafers. In certain implementations, the contact surfaces include microstructures that exploit intermolecular surface forces for increased adhesion and friction in the x-y direction during substrate transfer, while allowing easy release in the z-direction without tilting the substrate. Also provided are robot end effectors including the contact surfaces and related high-throughput transfer systems and methods.

19 Claims, 10 Drawing Sheets

(56) References Cited

OTHER PUBLICATIONS

Behabtu, et al. "Strong, Light, Multifunctional Fibers of Carbon Nanotubes with Ultrahigh Conductivity," Science pp. 182-186 (2013).
Daicho, et al. "Formation of Three-Dimensional Carbon Microstructures Via Two-Photon Microfabrication and Microtransfer Molding," Optical Materials Express (2013).
Ge, et al. "Carbon Nanotube-Based Synthetic Gecko Tapes," PNAS pp. 10792-10795 (2007).
Lee, et al. "Gecko-Inspired Combined Lamellar and Nanofibrillar Array for Adhesion on Nonplanar Surface," Langmuir 25 pp. 12449-12453 (2009).
Lee, et al. "Fabrication of Nanowire Electronics on Nonconventional Substrates by Water-Assisted Transfer Printing Method," Nano Letters pp. 3435-3439 (2011).
Liu, et al. "Research, Design and Experiment of End Effector for Wafer Transfer Robot," Industrial Robot: An International Journal pp. 79-91 (2012).
Murphy, et al. "Enhanced Adhesion by Gecko-Inspired Hierarchical Fibrillar Adhesives," ACS Applied Materials and Interfaces pp. 849-855 (2009).
Park, et al. "A Review of Fabrication and Applications of Carbon Nanotube Film-based Flexible Electronics," Nanoscale pp. 1727-1752 (2013).
Tian, et al. "Bridging Nanocontacts to Macroscale Gecko Adhesion by Sliding Soft Lamellar Skin Supported Setal Array," Scientific Reports pp. 1-6 (2013).
Wang, et al. "Mechanotunable Microstructures of Carbon Nanotube Networks," ACS Macro Letters pp. 1176-1179 (2012).
Zhou, et al. "Anisotropic Interfacial Friction of Inclined Multiwall Carbon Nanotube Array Surface," Carbon 50 pp. 5372-5379 (2012).
CN Office Action dated Jan. 24, 2017, issued in Application No. 201410831638.X.

* cited by examiner

MICROSTRUCTURES FOR IMPROVED WAFER HANDLING

BACKGROUND

Different types of tools are used to perform hundreds of processing operations during semiconductor device fabrication. Most of these operations are performed in process chambers at very low pressure, i.e., in a vacuum or partial vacuum. Such process chambers may be arranged about a central hub, and the hub and process chambers may be kept at substantially the same very low pressure. Wafers may be introduced to the process chambers by wafer handling systems that are mechanically coupled to the process chambers and/or central hub. The wafer handling systems transfer wafers from the factory floor to the process chamber. The wafer handling systems may include load locks to bring the wafers from atmospheric conditions to very low pressure conditions and back, and robots to transfer the wafers to various positions. Wafer handling systems may utilize robots that operate outside of the vacuum environment, e.g., robots that operate in the ambient factory floor environment, and robots that operate within the very low pressure environment of the process chambers and central hub. Throughput—the number of wafers processed in a period of time—is affected by the process time, the number of wafers that are processed at a time, and the time it takes to introduce the wafers into the vacuum process chambers.

SUMMARY

One aspect of the subject matter described herein can be implemented in a contact pad for an end effector. The contact pad can include structures arrayed on a contact pad base, each structure including a flexible member and a plurality of contact members connected to the flexible member, with the flexible member configured to deflect on application of a substrate and the contact members configured to adhere to a substrate by van der Waals adhesion. The structures can be arrayed in various arrangements according to various implementations. For example, the structures can be arranged in circumferential rows extending around the center of the contact pad base. In some implementations, the structures are arranged in a plurality of zones configured such that release of a substrate from the contact pad is staged by zone. In some implementations, the altitudes and/or effective spring constants of the plurality of structures vary across the contact pad. The variance in altitude and/or effective spring constant may be symmetric about a point. For example, the variance may circular symmetry.

The flexible members can have various sizes. In some implementations, the largest dimension of a flexible member is less than 1 mm. In the same or other implementations, the smallest dimension of a flexible member can be less than 100 microns. Examples of materials of flexible members can include carbon, such as carbon nanotube networks, and polymeric materials. The contact members can also have various sizes. The contact members can various sizes. In some implementations, the smallest dimension of a contact member is less than 1 micron, or less than 500 nm. In some implementations, each contact member can include a base split into a plurality of free ends.

Another aspect of the subject matter described herein can be implemented in a contact pad for an end effector including a plurality of structures arrayed on a contact pad base, each of the plurality of structures having an effective spring constant and an altitude, with at least one of the effective spring constant of the plurality of structures varies across the contact pad. In some implementations, the variance in altitude or effective spring constant can have circular symmetry.

Another aspect of the subject matter described herein can be implemented in an end effector having one or more end effector contact pads as described herein.

Another aspect of the subject matter described herein can be implemented a robot having one or more arms; a motor configured to move the one or more arms; and one or more end effectors attached to the one or more arms. The one or more end effectors can be configured to transfer a semiconductor substrate by passive contact at an acceleration of at least about 0.5 g in the x-y direction without slipping and configured for non-actuated release the semiconductor substrate on application of a normal force without tilting the semiconductor substrate. In some implementations, the one or more end effectors are operable to support semiconductor substrates at temperatures above 400° C. In some implementations, the one or more end effectors can be configured to transfer a semiconductor substrate of at least 300 mm in diameter, or at least 450 mm in diameter.

Another aspect of the subject matter described herein can be implemented in semiconductor process tool. The process tool can include a transfer module configured to connect to one or more process modules and configured to transfer semiconductor substrates to and from the one or more transfer modules. The transfer module includes a robot having one or more end effector contact pads as described in the disclosure. In some implementations, the process tool further includes one or more process modules connected to the transfer module. In some implementations, the transfer module is configured to connect to and transfer semiconductor substrates to and from a load lock or substrate storage location. The transfer module may be a vacuum or atmospheric transfer module. The process tool may further include a controller that includes machine readable instructions to move the end effector in the x-y direction at an acceleration of at least 0.5 g, at least 1 g, or higher.

Another aspect of the subject matter described herein can be implemented in a method of releasing a substrate from an end effector. The method can include providing a substrate supported by an end effector by passive contact, the substrate being supported by van der Waals adhesive forces between the substrate and a plurality van der Waals structures on the end effector; and applying a force normal to the substrate to lift it from the end effector, thereby causing the van der Waals forces to disengage, such that the substrate remains untilted throughout the disengagement. In some implementations, the release is staged such that force normal is less than the adhesive forces.

These and other aspects of the subject matter disclosed herein are described further below with reference to the Figures.

BRIEF DESCRIPTION OF DRAWINGS

FIG. 2d shows an enlarged view of an example of the contact structure shown in

FIG. 2a.

FIG. 4b shows a schematic cross-sectional view along line A of FIG. 4a of the innermost three zones of the end effector contact pad in FIG. 4a.

DETAILED DESCRIPTION

Figure 1:
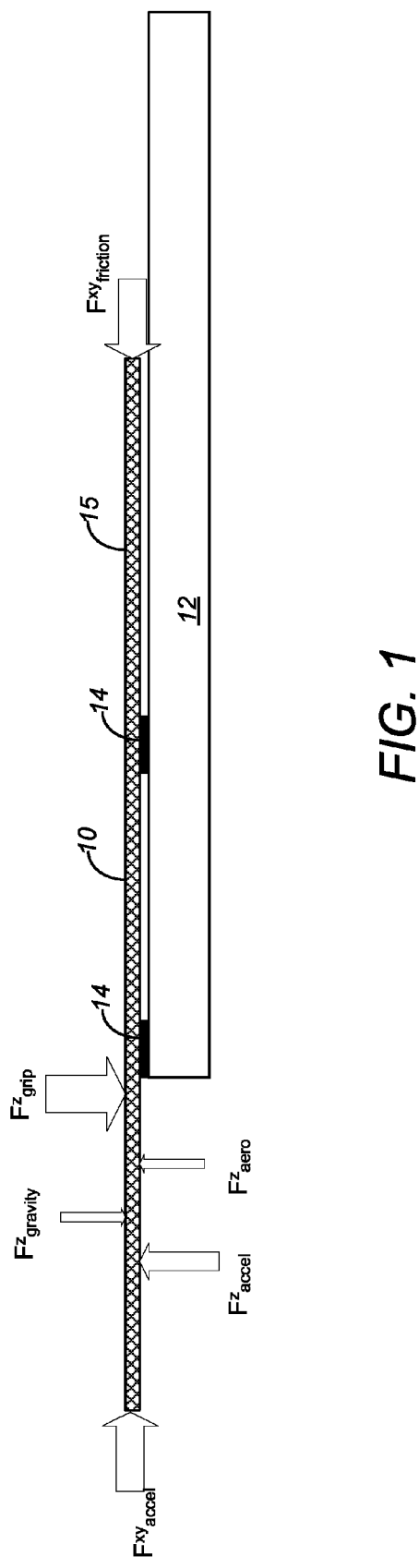
FIG. 1 shows an example of a simplified schematic of forces acting on a substrate supported on end effector contact pads of a robot end effector during substrate transfer.

Examples of various embodiments are illustrated in the accompanying drawings and described further below. It will be understood that the discussion herein is not intended to limit the claims to the specific embodiments described. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well-known process operations have not been described in detail in order not to unnecessarily obscure the present invention.

Apparatus, systems, and methods for substrate transport are provided herein. While the apparatuses, systems, and methods described can be used for semiconductor manufacturing, it should be understood they could be used in any processes or industries that transfer substrates, in particular other large area substrates such as glass panels for display technologies. For the purposes of discussion, the below description refers chiefly to semiconductor wafers, however it will be understood how to implement the methods, systems and apparatuses for transfer of other types of substrates and workpieces.

Semiconductor wafers are often introduced to processing stations or modules via wafer transfer apparatuses during integrated circuit fabrication. In many integrated circuit manufacture processes, wafers are processed at high temperatures—entering a wafer transfer apparatus "cold," typically between about room temperature and leaving the process module "hot," for example between about 30° C.-500° C. For example, an etch of a dielectric or conductor layer may be performed at a wafer temperature between about 30° C.-250° C. In another example, plasma enhanced chemical vapor deposition (PECVD) of a dielectric layer may be performed at a wafer temperature of about 300° C.-500° C.

A robot may transfer cold wafers from a first location, e.g., a load lock or storage location, to a process module for processing, and transfer processed hot wafers from the process module back to the first location or to another location. In many applications, the processes are operated in vacuum environments with a vacuum transfer module used to transfer wafers to and from the process modules. A vacuum transfer module robot within the vacuum transfer module may transfer cold wafers from a load lock or other location to a process module for processing, and transfer processed hot wafers from the process module back to the load lock or to another location such as a second process module connected to the vacuum transfer module.

An end effector is a device or tool connected to the end of a robot arm, such as a blade, paddle, or fork. As used herein, an end effector is any such support or device that physically contacts the wafer or other substrate to transport it. End effectors include generally flat supports, such as blades, paddles or forks, on which the wafer sits, as well as devices that hold the wafer in place, such as grippers. In some implementations of wafer transfer described herein, the wafer rests on two or more raised pads of the end effector. Throughput, the number of wafers that can be processed per hour, can depend on how fast wafers can be transferred between locations. Factors that can determine throughput include the limits of a robot motor as well on the maximum acceleration and deceleration that an end effector carrying a wafer may obtain without wafer slippage. The latter factor is determined by the coefficient of static friction of an end effector pad or other surface on which the wafer rests during transfer. Using materials with high coefficients of friction allow greater acceleration, reducing the time it takes to transport the wafers. As an example, perfluoroelastomers (PFEs) have coefficients of static friction around 1 for a silicon wafer. This is compared to a coefficient of about 0.3 for ceramics. As a result, the acceleration rate obtainable for a wafer on a PFE end effector is more than double than that obtainable for a wafer on a ceramic end effector.

FIG. 1 shows an example of a simplified schematic of forces acting on a substrate 10, such as a 450 mm semiconductor wafer, supported on end effector contact pads 14 of an end effector 12 during substrate transfer. Low particle requirements can preclude the use of front-side grippers or other contact with the front-side 15 of the substrate 10. In the example of FIG. 1, substrate contact is passive and limited to the backside of the substrate 10, such that there is no gripping force and $F^z_{grip}$ is zero. With no or negligible vibration and aerodynamic forces, $F^{xy}_{accel}$ depends on the coefficient of static friction (Cf) of the end effector contact pads 14, as well as the substrate mass and gravity. In the context of semiconductor processing, a 300 mm bare silicon wafer has a mass of about 0.128 kg, with a 450 mm bare silicon wafer having a mass of about 0.342 kg. PFEs and other elastomers have among the highest Cfs of homogenous materials at 0.75-1.5, but mechanically degrade at around 150° C.-300° C. Further Cfs of elastomers decrease with increasing temperature, for example decreasing from 1.5 at room temperature to 0.2 at high temperature. Ceramics, which can withstand higher temperatures, have fairly low Cfs of 0.2 to 0.5. Using ceramic materials significantly decreases allowable maximum acceleration and deceleration and reduces throughput.

The apparatus, systems, and methods described herein include high Cf contact surfaces that have high temperature tolerances. According to various implementations, the contact surfaces include microstructures that exploit intermolecular surface forces for increased adhesion and static friction (stiction) in the x-y-direction. Further, the contact surfaces may be configured to provide high stiction in the x-y-direction and very low or no stiction in the z-direction.

In some implementations, the microstructures are part of hierarchical structures configured such that a wafer or other large area substrate can be removed from the end effector without sliding or peeling the wafer from the end effector. Further, in some implementations, contact with the end effector is passive during load and/or release, requiring no mechanical, electrical, vacuum, or other type of actuation.

In various implementations, contact pads or other contact surfaces of the end effectors described herein include hierarchical structures having two or more levels. The multilevel hierarchical structures can include a contact structure including microscale or nanoscale contact members configured to adhere to the substrate due to van der Waals forces between these members and the substrate surface. The multilevel hierarchical structures can further include a flexible member directly or indirectly connecting the contact structure to an end effector or a contact pad base. In some implementations, the contact structures may be characterized as synthetic setae and/or synthetic spatulae, referring the hierarchical structure of gecko toes, discussed further below.

The term microstructure is used to refer to structures having at least one dimension less than 1000 microns. For example, the smallest of the length, width, height, or diameter of a microstructure may be less than 1000 microns. As discussed further below, in some implementations, the microstructures may have microscale and/or nanoscale dimensions. In some implementations, two or more dimensions, or all of the dimensions of the microstructure disclosed herein may be microscale and/or nanoscale. In some implementations, the microstructures may include hierarchical structures including a microscale level connected to a nanoscale level. As used herein microscale refers to dimensions between 1 micron and 1000 microns, with nanoscale referring to sub-micron dimensions greater than or equal to 1 nanometer.

Gecko toes include over 10 lamellae, each of which includes an array of over thousand setae. A seta of a tokay gecko can be about 100 microns in length and 4 microns in diameter. Each seta branches into 100 to 1000 spatulae, which include a spatula stalk and a tip and that may be about 100 nm in diameter. While replicating this multi-level hierarchy may result in adhesions approaching that of geckos (10 N/cm2), the end effectors described herein may use simpler hierarchical structures, while relying on the van der Waals forces between the microstructures of the contact structure and the substrate surface for adhesion. The intermolecular force between two surfaces (e.g., the end effector and the substrate) is strongly correlated to the number of contacts. According to various implementations, and depending on the mass of the substrate to be moved and the desired allowable acceleration, the end effectors described herein may have thousands, tens of thousands, hundreds of thousands, millions, or more individual contacts. As an example, a 1 cm gecko foot is able to hold approximately 1 kg with a Cf near 3, almost double that of a room temperature elastomer.

According to various implementations, the end effectors described herein include one or more of the following features: 1) a flexible structure configured to move laterally with respect to a normal force on application and/or release of the force, e.g., such that the structure slides along a substrate during loading and unloading of the substrate; 2) a multilevel hierarchical structure including van der Waals-based contact structures and a flexible member to connect the van der Waals-based contact structures to a contact pad base; and 3) multiple microstructures arrayed three-dimensionally to permit controlled engagement and release. Each of these aspects is described in further detail below.

Figure 2A:
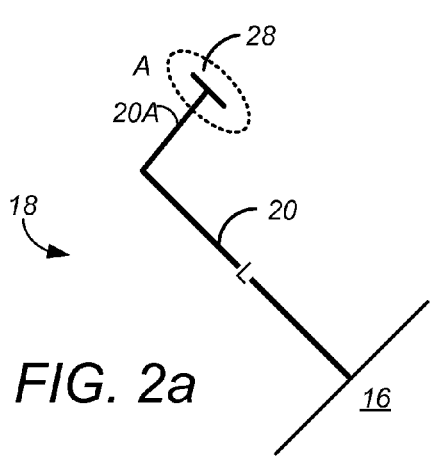
FIG. 2a shows a schematic of an example of a flexible van der Waals-based microstructure, including a flexible member connected to a contact structure, in an unloaded state.
Figure 2D:
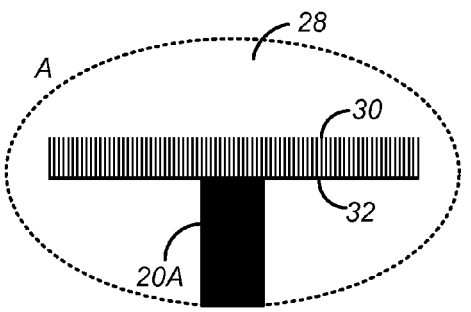
Figure 2B:
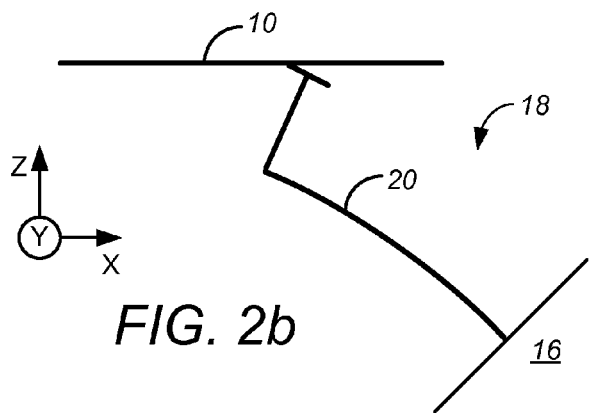
FIG. 2b shows the flexible van der Waals-based microstructure in FIG. 2a during loading of a substrate thereon.
Figure 2C:
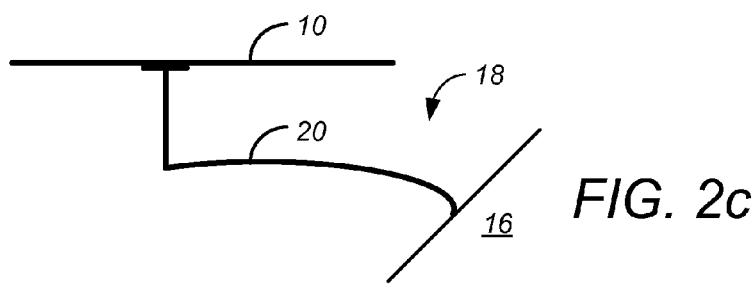
FIG. 2c shows the flexible van der Waals-based microstructure in FIG. 2a in a loaded state.
Figure 3A:
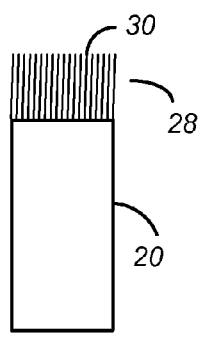
FIG. 3a shows a schematic of an example of a contact structure connected to a flexible member of a van der Waals-based microstructure.
Figure 3B:
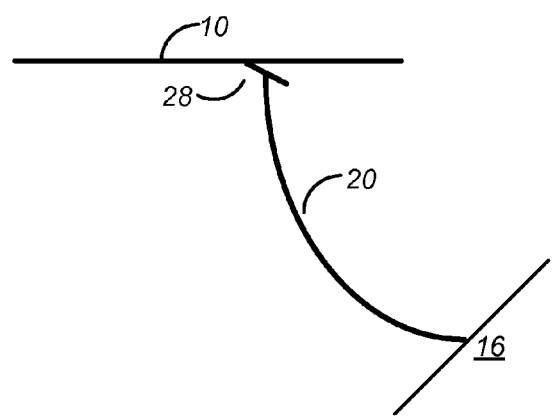
FIG. 3b shows a schematic of an example of a flexible van der Waals-based microstructure, including a flexible member connected to a contact structure, during loading of a substrate thereon.

Turning to FIGS. 2a-2d, a van der Waals-based flexible structure is shown. As used herein, a van der Waals-based structure refers to a structure in which most or substantially all of adhesive strength or frictional force of the structure is provided by intermolecular forces between the structure and the substrate. FIG. 2a shows an example of a flexible van der Waals-based microstructure 18, including a flexible member 20 connected to a contact structure 28, in an unloaded state. In the example of FIG. 2a, the flexible member 20 can be characterized as a spring cantilever connected to an end effector pad base 16. Details of the contact structure 28 are shown in inset A in FIG. 2d and include multiple nanohairs 30 arrayed on a backing layer 32 connected to a transverse portion 20A of the flexible member 20. The nanohairs 30 are configured to come into very close proximity with the substrate in a loaded state, with the proximity and abundance of the nanohairs 30 across multiple van der Waals-based microstructures 18 of an end effector pad providing a frictional force greater than that of an elastomer. While FIGS. 2a and 2d show examples of possible arrangements of a flexible member and a contact structure including nanofibers, it is understood that many other arrangements are possible. For example, in some implementations, the nanohairs 30 may extend directly from the flexible member 20 without an intermediate backing layer 32; a schematic of an example of such an implementation is shown in FIG. 3a. In another example, the flexible member 20 may not include transverse portion 20A, with a spring cantilever directly connected to the end effector pad base 16 to the contact structure 28; a schematic of such an example is shown in FIG. 3b. The structure in FIG. 3b is shown during substrate loading, described further below with respect to FIG. 2b.

Figure 3C:
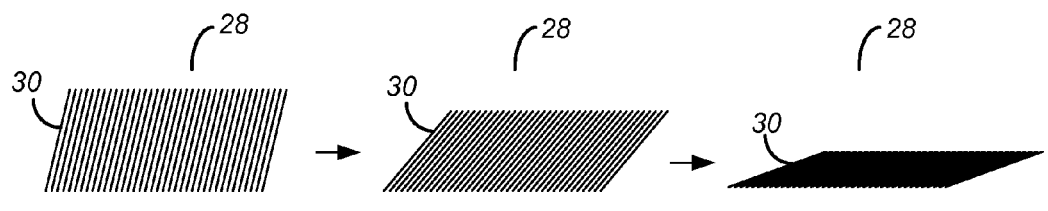
FIG. 3c shows a schematic of an example of nanostructures of a contact structure of a van der Waals-based microstructure during loading.

Sliding of a gecko setal array has been shown to provide effective attachment and detachment (Tian et al., Scientific Reports 3:1382 (2012), incorporated by reference herein). In some implementations, the van der Waals-based microstructure 18 in FIGS. 2a-2c permits the contact structure 28 to slide passively on application or release of a load, without actuation, as schematically illustrated with respect to FIGS. 2b and 2c. In FIG. 2b, a substrate 10 is brought into contact with the van der Waals-based microstructure 18. The flexible member 20 begins to deflect, allowing the contact structure 28 to slide across the substrate 10. Without being bound by a particular theory, attachment may involve the following mechanism described in Tian with respect to a setal array: normal and friction forces compress the nanohairs 30, resulting in a lower tilt angle and increasing these forces. This will continue until a crowded state of the nanohairs 30 is reached. See FIG. 3c, in which the nanohairs 30 of the contact structure 28 are compressed during loading stages 40a and 40b, until the nanofibers reach a crowded state 40c when loaded (substrate not shown). FIG. 2c shows the van der Waals-based microstructure 18 in a corresponding loaded state. The flexible member 20 allows the van der Waals-based microstructure 18 to slide against the substrate 10 held stationary in the x-y direction. This is also true for release (e.g., going from FIG. 2c to FIG. 2b), such that the substrate is not peeled off, but lifted in the z-direction with no tilting. This is a significant difference from end effectors employing microfiber arrays with simple upstanding fibers that do not slide. While those end effectors can hold a wafer upside down against gravity, releasing the wafer involves tilting the wafer at angle to peel it away from the end effector.

According to various implementations, contact members (such as the nanohairs 30 in the examples above) may be microscale or nanoscale, with example lateral dimensions (e.g., diameter or width) being between tens of nanometers and tens of microns.

In some implementation, at least the free ends of the contact members are sub-micron and may have a lateral dimension (e.g., a diameter or width) less than 500 nm, less than 100 nm, less than 50 nm, or less than 20 nm. The contact members may have a generally constant or variable cross-section. In some implementations, the contact members may narrow from the tethered end to the free end. Also, in some implementations, a base of a contact member may split into multiple free ends. For example, in some implementations, the contact members may be or mimic setae and spatulae of a gecko's toe. Setae of a tockay gecko are about 4.2 microns, for example, with the tip of each seta splitting into hundreds of spatular stalks and spatula, which are about 100 nm in diameter.

As the adhesion, allowable acceleration, and friction-limited throughput correlate to the number of contacts, in some implementations, it may be advantageous for at least the free ends of the contact members to be sub-micron to permit a greater number of contact members. Further, smaller contact members may reduce the total contact area, which can be desirable for particle control. However, in some implementations, the free ends of the contact members may be between 1 and 100 microns, or between 1 and 10 microns. Liu demonstrated an increase in acceleration in wafer transport over standard end effectors for using an array of 5 micron diameter fibers. (Liu et al. Industrial Robot 39/1 (2012) 79-91). Example lengths of the contact members may be between about 1 and 500 microns, though other appropriate lengths may be employed.

Figure 3D:
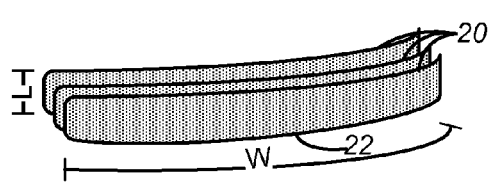
FIG. 3d shows a schematic of an example of flexible members of a van der Waals-based structure.

Example lengths of the cantilevers of the flexible members (see, e.g., length L in FIG. 2a) may be between about 1 micron to 1000 microns long, for example 10 microns to 500 microns. In some implementations, the flexible members may be or mimic lamellae of a gecko's toe. In some implementations, the flexible members may in the form of fibers or rods, extending generally in only one dimension, along the length of the cantilever. In some implementations, the flexible members may extend in a second dimension transverse to the direction of deflection. An example is shown in FIG. 3d, which shows three flexible members 20, extending along width W transverse to the length L. Each flexible member 20 is anchored to an end effector pad base (not shown) along a side 22. In the example shown in FIG. 3d, the width W is greater than the length L, though in other implementations, the length may be greater than or about the same as the width. Examples of widths include 1 microns to 1000 microns. In some implementations, the flexible members may have some amount of curvature, for example, to extend at least partially around a center of an end effector pad base. In some implementations, the flexible members may be or mimic setae of a gecko's toe. Example lengths in such implementations may be on the order of 1 micron to 10 microns. In such implementations, the contact members may be sub-micron.

The examples described above refer to van der Waals-based structures having dual- or higher-level hierarchies. For example, an array of 5 micron diameter contact members on a 500 micron wide flexible member can be characterized as a dual-level hierarchical structure. Implementations in which the 5 micron contact members further split into 500 nm free ends can be characterized as a three-level hierarchical structure. In some implementations, the structures described herein may include additional levels, for example, they may include four levels, with free ends of the structures configured for van der Waals interaction with the substrate surface directly or indirectly connected to flexible members configured to deflect under application of a load. Still further, in some implementations, a single hierarchical level may be employed, with the free ends of the flexible members configured for van der Waals interaction with the substrate. In this manner, a micro- or nanostructure can act as both flexible member and a contact member.

Figure 4A:
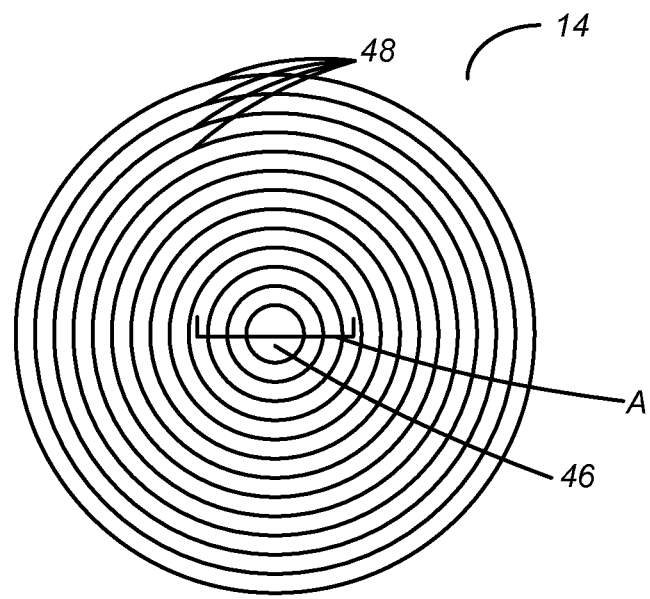
FIG. 4a shows a schematic of an example of a top-down view of an end effector contact pad including multiple zones of van der Waals-based microstructures.
Figure 4B:
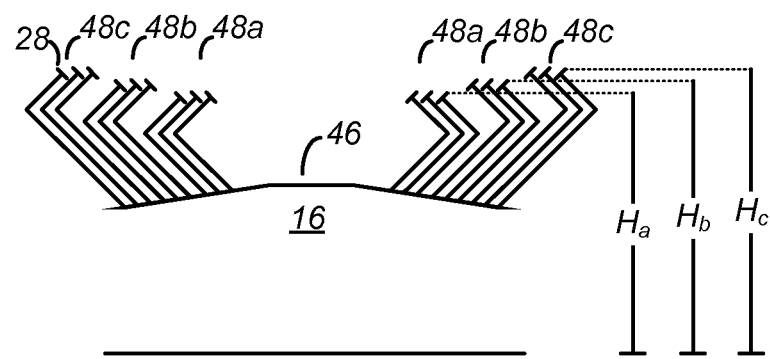

In some implementations, multiple microstructures are arrayed three-dimensionally to permit controlled engagement and release. FIG. 4a shows a schematic example of a top-down view of an end effector contact pad 14 including multiple zones 48. Each zone 48 may include one or more rows of van der Waals-based microstructures configured such that release of a substrate from the end effector occurs sequentially by zone. In this manner, the force used to release the substrate is significantly reduced such that the substrate does not pop off or unnecessarily generate particles. In the example of FIG. 4a, the zones 48 extend circumferentially around the center 46 of the pad. FIG. 4b shows a schematic cross-sectional view along line A of FIG. 4a of the innermost three zones 48. In FIG. 4b, these zones are labeled 48a, 48b, and 48c. In the schematic example of FIG. 3b, each of these zones includes three rows of van der Waals-based structures. One or both of the effective spring constants and altitudes of the van der Waals-based structures differ across zones 48a-48c such that release of the substrate occurs in stages. In the example of FIG. 4b, zone 48a has an altitude Ha, zone 48b has an altitude Hb, and zone 48c has an altitude Hc, with Hc>Hb>Ha. The altitudes are shown as measured from the bottom of the end effector pad base 16 to the uppermost point of the contact structure 28, though they can be measured from any common reference plane that is parallel to the plane of the end effector surface or to a loaded, untilted substrate.

The contact structures 28 of the zones 48a-48c will contact a substrate placed on the end effector pad base 16 according to altitude of the zone, with the tallest zone (zone 48c in FIG. 4b) contacting the substrate first, followed in succession by other zones in order of altitude. The altitudes can be configured such at any one time, a force F lifting the substrate has to overcome the van der Waals forces of only one zone. In some implementations, the difference in altitudes is such that as soon as one zone is cleared, the next one starts releasing. For example, in FIG. 4b the difference is altitudes for successive zones can be the height of the tilted contact structure 28. In particular examples, there may be hundreds or thousands of zones, the altitude of each one differing by only a few nanometers.

Figure 5A:
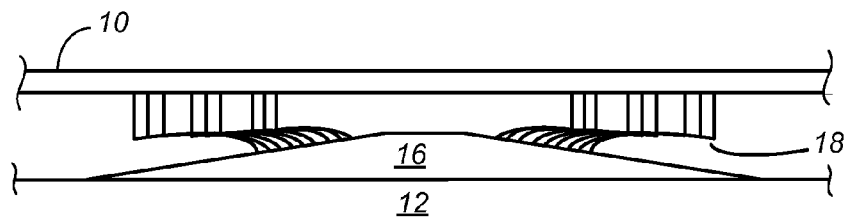
FIGS. 5a-5e illustrate staged substrate release from an end effector pad base of a loaded end effector including a contact pad having van der Waals-based microstructures arranged in zones of varying altitude.

FIGS. 5a-5e illustrate substrate release from an end effector pad base 16 of a loaded end effector 12. For ease of illustration, only three zones are depicted as in FIG. 4b, though according to various implementations, an end effector pad may have tens, hundreds, thousands, hundreds of thousands or more zones. Also, for ease of illustration, each zone is depicted as having three rows of van der Waals-based microstructures, though according to various implementations, each zone may include from one to hundreds, thousands, or more rows. Turning first to FIG. 5a, end effector 12 includes an end effector pad base 16 and van der Waals-based microstructures 18, which support substrate 10. In the loaded state shown in FIG. 5a, the substrate 10 can be moved in the x-y direction by the end effector 12 at a maximum acceleration limited by the maximum friction force between the substrate 10 and the van der Waals-based microstructures 18. The maximum friction force between the substrate 10 is correlated to the number of van der Waals-based microstructures 18. The van der Waals-based microstructures 18 are in a crowded state when loaded.

Figure 5B:
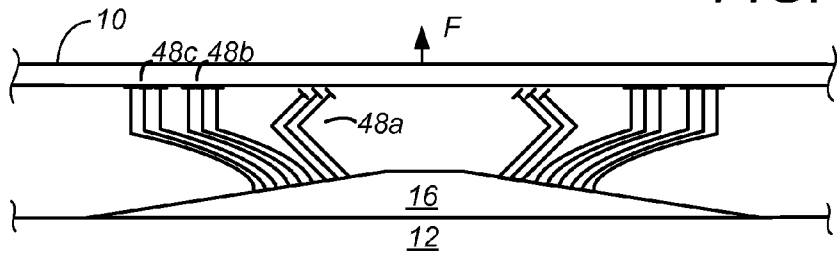
Figure 5C:
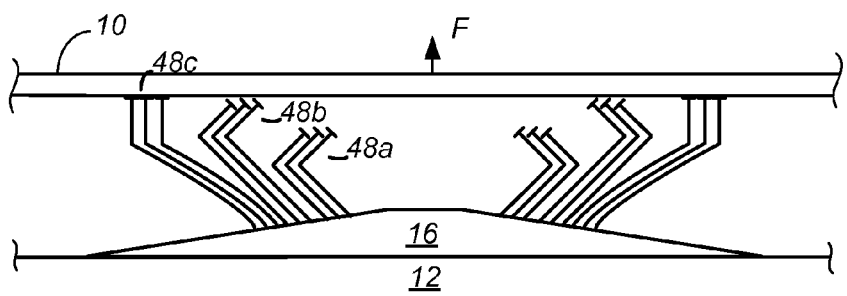
Figure 5D:
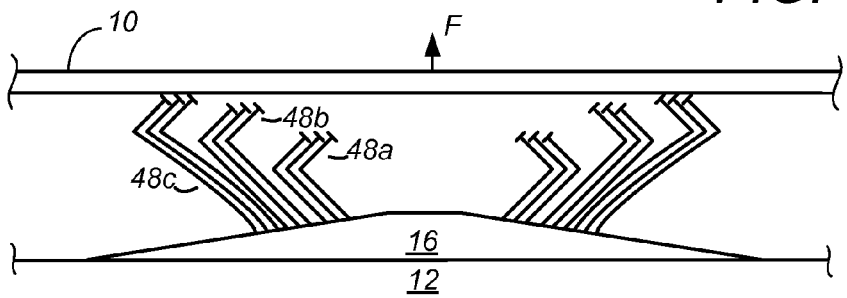
Figure 5E:
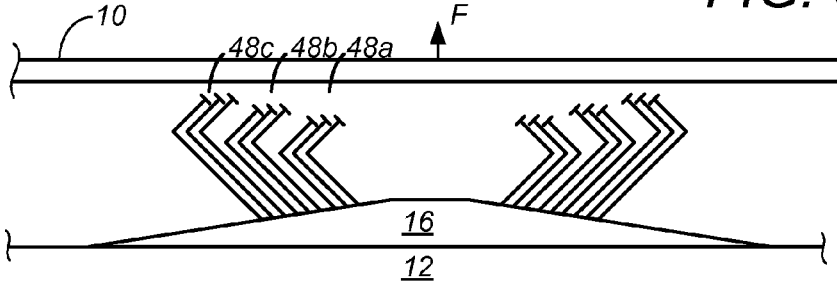

FIGS. 5b-5d show the van der Walls-based structures during release. First in FIG. 5b, the innermost zone, zone 48a, is released while zones 48b and 48c remain engaged with the substrate 10. The van der Waals-based microstructures in zone 48a are shown in a relaxed, non-compressed and non-extended state, once the load of the substrate 10 is released. As the substrate 10 continues to be lifted, the next zone 48b of van der Waals-based microstructures is peeled off, as shown in FIG. 5c. In FIG. 5d, as the substrate 10 continues to be lifted off the end effector 12, the van der Waals-based microstructures of zone 48c are depicted as they are sliding or peeling off the substrate 10. The spring cantilevers of the van der Waals-based microstructures of zone 48c are not fully relaxed, with the contact structures partially released. The substrate 10 is shown released from the end effector in FIG. 5d, with the van der Waals-based structure in zones 48a-48c returned to an uncrowded relaxed, non-compressed and non-extended, state.

The force F to lift the substrate 10 in the example of FIGS. 5a-5e is sufficient to overcome the adhesive force between the substrate 10 and the van der Waals-based microstructures in a single zone, allowing a much smaller force to be used than if all of the van der Waals-based structures were to peel off at the same time.

In the example of FIG. 5a, the van der Waals-based microstructures 18 have flexible members connected to contact members as described above with respect to FIGS. 2a-3d such that they are configured to slide across the substrate 10 as it is lifted. In alternate implementations, the van der Waals-based microstructures may not be configured to slide across the substrate 10; for example, zones 48a-48c can include vertical arrays of nanofibers, with the height of the nanofibers varying from zone to zone for staged removal. A substrate may be peeled off or otherwise removed from the nanofibers at forces less than those used to remove the substrate in a non-staged release process.

Staged release of the van der Waals-based structures can depend on an effective spring constant of the structures in each of the zones, such that the altitude of the van der Waals-based structures can be constant (or varied) across the zones with the spring constant varied across the zones. An example is shown in FIGS. 6a-6d.

Figure 6A:
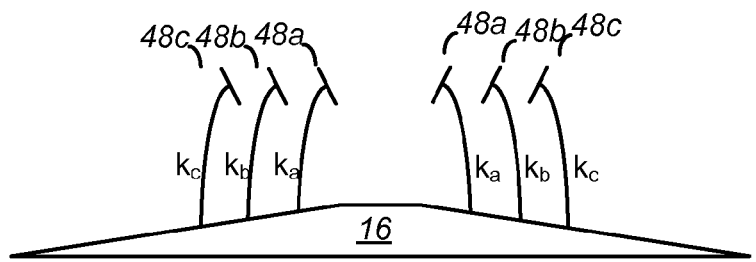
FIGS. 6a-6d illustrate staged substrate release from an end effector pad base of a loaded end effector including a contact pad having van der Waals-based microstructures arranged in zones of varying spring constant.

FIG. 6a shows a schematic cross-sectional view of van der Waals-based structures of three zones 48a, 48b, and 48c on and end effector pad base 16. For ease of illustration, only three zones are depicted, though according to various implementations, an end effector pad may have tens, hundreds, thousands, hundreds of thousands or more zones. In the schematic example of FIG. 6a, each of these zones includes one row of van der Waals-based microstructures. The effective spring constants of the van der Waals-based structures differ across zones 48a-48c such that release of the substrate occurs in stages. In the example of FIG. 6a, zone 48a has an effective spring constant ka, zone 48b has an effective spring constant kb, and zone 48c has an effective spring constant kc with ka>kb>kc. An effective spring constant of a van der Waals-based microstructure used herein refers to the spring constant of the microstructure as a whole that characterizes the stiffness of microstructure and how it opposes the van der Waals adhesive forces.

Figure 6B:
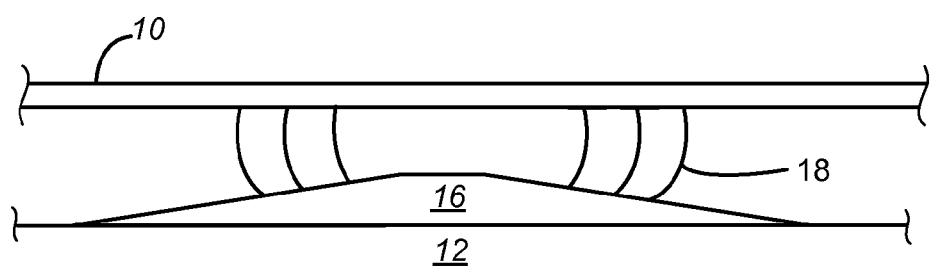
Figure 6C:
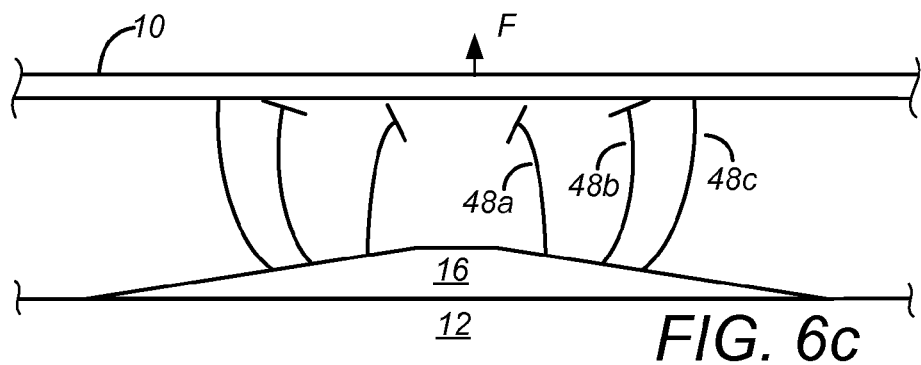
Figure 6D:
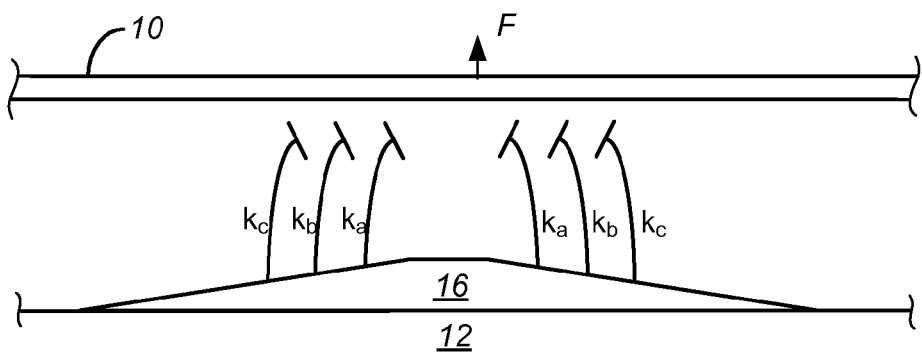

FIGS. 6b-6d illustrate substrate release from an end effector pad including the structure shown in FIG. 6a. In FIG. 6b, van der Waals-based microstructures 18 on an end effector pad base 16 of an end effector 12 support a substrate 10. In the loaded state shown in FIG. 6b, the substrate 10 can be moved in the x-y direction by the end effector 12 at a maximum acceleration limited by the maximum friction force between the substrate 10 and the van der Waals-based structures 18.

In FIG. 6c, the innermost zone, zone 48a, is released while zone 48c remains engaged with the substrate 10 and the van der Waals-based structures of zone 48b sliding or peeling off the substrate 10. In FIG. 6d, the substrate 10 is shown released from the end effector, with the van der Waals-based microstructures in zones 48a-48c returned to a relaxed, non-compressed and non-extended, state.

The effective spring constant of a van der Waals-based microstructure can be characterized by the force to compress or extend the structure by a certain displacement from the structure's relaxed state. An effective spring constant can depend on the various factors including the modulus of elasticity of the material, and the length and shape of the structure. Approximating a van der Waals-based structure as an end loaded cantilever beam, the displacement can be approximated as FL3/3EI, with F being the van der Waals force, L being the length of the beam, E being the modulus of elasticity, and I the area moment of inertia. Assuming a constant force, modulus of elasticity and moment of inertia across all microstructures of an end effector pad, in some implementations, the length of the van der Waals-based structure can be varied from zone to zone. In some implementations, any of the other factors may be varied in addition to or instead of the length. For example, the modulus of elasticity can be varied by using different materials in different zones, the moment of inertia can be varied by varying the geometry of the structures from zone to zone, and the force can be varied by varying the number of contact members on a structure from zone to zone.

In the examples of FIGS. 5a-5e and 6a-6d, the zones are configured such that the staged release occurs radially outward. In other implementations, the zones may be configured such that the stage release occurs radially inward, for example, the lengths of the van der Waals-based structures increase toward the center of the pad. In alternative implementations, it may be advantageous for non-adjacent zones to release in succession; for example, a zone near the center of the substrate may release first, followed by a zone near the outer circumference of the substrate, etc.

According to various implementations, the zones are not necessarily circular, but can be represented by curved or straight lines arranged in any suitable fashion. For example, a contact surface may be square-shaped and made up of thousands of zones each arranged in a straight line.

Figure 7B:
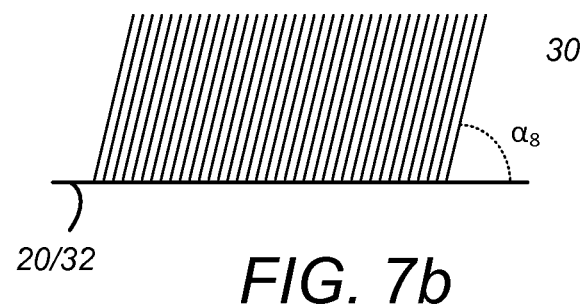
FIGS. 7A and 7B show schematic diagram of examples of angles of van der Waals-based microstructures that may be varied according to particular implementations.
Figure 7A:
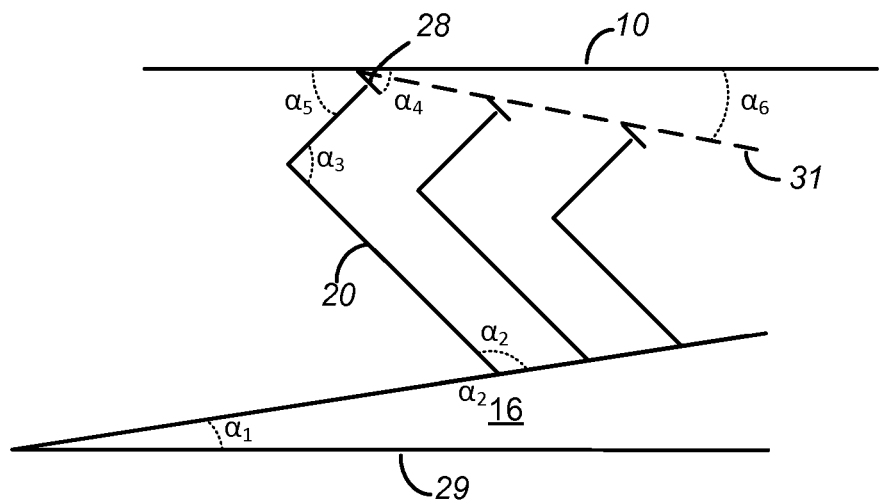

The van der Waals-based microstructures can be configured in some implementations to tilt with respect to a substrate as it is lifted off the end effector pad, peeling away from the substrate. The tilting and peeling behavior, which can allow the substrate to be lifted off without having to tilt or peel the substrate, can be an artifact of the height, the effective spring constant, the angle of the pad base and how the van der Waals-based structures are arranged. FIG. 7A shows an example of a schematic diagram of angles that may be varied according to particular implementations. One or more of these angles may be varied, along with the length and elastic modulus of the van der Waals-based structure, to control peeling and other characteristics of the van der Waals-based structures during release. Angle $\alpha_1$ controls the slope of the end effector pad base 16, and can range from 0° (flat base) to over 45°. In some implementations, the pad base is fairly shallow, e.g., with $\alpha_1$ between 0° and 15°. Angle $\alpha_2$ is the angle at which the flexible member 20 projects from the contact pad base 16 and angle $\alpha_3$ is the angle at which the transverse portion 20A (if present) projects from the rest of the flexible member 20. Example values for $\alpha_2$ may range from 20° to 160°. Note that in implementations in which $\alpha_2$ is an acute angle, the contact structure 28 may face radially outward. Example values of $\alpha_3$ may range from 20° to 160°, with $\alpha_2$ and $\alpha_3$ having values such that the van der Waals-based structure is configured to contact a substrate during loading. Angle $\alpha_4$ is the angle at which the contact structure 28 is tilted with respect to the substrate 10. Example values of $\alpha_4$ may range from 0° (flat with respect to the substrate 10) to 80°, with larger values such as between about 40° and 80° providing more tilting. In some implementations, angle $\alpha_4$ is or can approximate a peel angle of the van der Waals-based structures from the substrate 10. In some implementations, angle $\alpha_4$ may be characterized as an angle between a contact member base (such as backing plane 32 or flexible member 20) from which contact members project, and a plane that is parallel to a surface 29 and that is just above the contact structure 28. This is the plane of an untilted substrate just prior to engaging with the contact structure 28; in the example of FIG. 7A, the plane of the substrate 10. The surface 29 of the end effector pad base 16 can be the surface that is configured to attach to an end effector. Angle $\alpha_5$ is the angle at which the flexible member 20 is tilted with respect to the substrate 10. In some implementations, angle $\alpha_5$ is or can approximate a peel angle of the van der Waals-based structures from the substrate 10. Example values of $\alpha_5$ may range from 20° to 160°. In some implementations, angle $\alpha_5$ may be characterized as an angle between the flexible member 20 and a plane that is parallel to the surface 29 and that is just above the contact structure 28 as described above. Angle $\alpha_6$ can be a factor in the rate of engagement and disengagement with successive zones. Example values of $\alpha_6$ may range from 1° to 20°, with lower values providing smoother engagement and disengagement. In some implementations, angle $\alpha_6$ may be characterized as an angle between a line connecting the tops of multiple structures (e.g., line 31 in FIG. 7A) and a plane parallel to the surface 29 and above these structures (e.g., the plane of the substrate 10 in FIG. 7A). FIG. 7B shows an example of a contact structure 28 having nanohairs 30 on a backing plane 32 or flexible member 20. Angle $\alpha_8$ is the angle at which the nanohairs 30 tilt with respect to the backing plane 32/flexible member 20.

As discussed above, end effector pads disclosed herein include van der Waals-based structures that may be flexible and are configured to adhere to a semiconductor wafer or other substrate via van der Waals intermolecular potentials.

According to various implementations, the van der Waals-based substrates may be multilevel hierarchical structures or single level structures. Materials for the van der Waals-based microstructures can include carbon-based materials including carbon nanotubes (CNTs) and graphene. Materials can also include polymer materials such as various thermoplastics such as polyimides and polyethylene terephthalate, flexible metal materials and metal-crystalline hybrids, and semiconductor materials such as silicon. Some implementations of the van der Waals-based microstructures are flexible and resilient, having a strength large enough to support a load and undergo repeated deflections without breaking. Carbon is desirable as a material as it is very strong, flexible, and has a high heat tolerance. Carbon structures, in the form of tubes, rods, wires, etc. may be microscale and/or nanoscale as described above. Polymer materials may be advantageous for applications that do not require high temperature tolerances, as they are flexible and easy to manufacture in a variety of structures.

For multilevel hierarchical structures, the different hierarchical levels may be the same or different materials. In some implementations, carbon-based materials may be used for all of the levels, for example including flexible members and contact members.

According to various implementations, the flexible members may be grown, e.g., by chemical vapor deposition (CVD) on a substrate, formed by etching a masked material, and formed by micro- or nanoimprint templating or another mold process. Nanohairs or other contact members may be grown on top of the flexible members, e.g., by catalyzed chemical vapor deposition methods, or bonded to the flexible members post-fabrication. A pad base may be any material that can have flexible members grown or printed on, or to which post-manufacture flexible members can be bonded. Examples include metals and silicon. Polymer structures may be formed by a variety of methods including nanoimprint templating, self-assembly of block copolymer materials, and lithography. Metal structures may be formed by vapor deposition techniques, including CVD, physical vapor deposition (PVD), and atomic layer deposition (ALD). Silicon structures, including silicon nanowires, may be formed by various methods such as catalyzed CVD or etching of a silicon substrate.

Vapor deposition of carbon microscale and nanoscale structures including CNTs, can involve catalyst-initiated thermal decomposition of a carbon-containing gas such as ethylene. In some implementations, growth can be controlled by controlling catalyst placement, deposition into a sacrificial template, and the like. In some implementations, deposition can be performed on the surface that the structure will be on in the fabricated end effector pad, for example, directly on an end effector pad base, a flexible member, or other level in a multilevel hierarchical structure. In some other implementations, the CNTs or other structures can be removed from the deposition surface and attached to an end effector pad base, flexible member, etc.

As indicated above, in some implementations, the microscale and nanoscale described herein may be inclined relative to an end effector pad base, or other part of the van der Waals-based structure. Zhou et al., Carbon 50 (2012) 5372-5379, incorporated by reference herein, disclose forming inclined structures. In Zhou, well-defined multiwall carbon nanotube (MWCNTs) arrays were fabricated by catalyzed CVD on a silicon substrate. The MWCNT arrays were characterized by MWCNT diameters of 10-15 nm, lengths of about 400 microns, and a density of $10^{10}$ to $10^{11}$ MWCNT/cm$^2$. The nanotubes were inclined by peeling the MWCNT arrays off the silicon substrate using an electrostatic adsorption film followed by compressing the arrays using a sliding compression machine. In addition to MWCNTs including double-walled CNTs (DWCNTs), single-walled CNTs (SWCNTs) may be used. In this manner, CNTs may be used to form flexible members and/or contact members having certain inclination angles in their relaxed states.

CNT fibers may be used for various hierarchical levels including flexible members and/or contact members. Behabtu et al., Science 339, 182 (2013), incorporated by reference herein, disclose the manufacture of CNT fibers having high tensile strength, modulus, and elongation.

In implementations in which nanostructures are not grown directly on another component of the end effector pad, various transfer methods may be used. These include peeling nanostructure arrays using adsorption and transfer printing using elastomers. For example, a metal layer can be deposited on top of a SWNT with polydimethylsiloxane (PDMS) used to transfer the metal/SWNT layer to the desired surface, with the metal layer removed using chemical etchants.

Lee at al., Nano Lett. 2011, 11, 3435-3439, incorporated by reference herein, disclose a transfer printing method that uses a phenomenon of water penetrating into an interface between a nanostructure and a donor substrate, allowing lift-off of the nanostructure from the donor substrate, and adhesion to the target surface. In addition to CVD deposition, techniques such as printing may be used to form the structures disclosed herein. For example, Park et al. Nanoscale, 2013, 5, 1727-1752, incorporated by reference herein disclose ink-jet and aerosol printing of single walled nanotubes (SWNTs).

In addition to using various methods to separately fabricate different levels of a multilevel hierarchical structure, techniques for co-fabrication of multiple levels may be performed. Examples of such methods are given below. Ge et al., Proc. Natl. Acad. Sci. 2007, 104, 10792-10795, incorporated by reference herein disclose bundling carbon nanotubes into pillars, which deform together while having individually exposed tips. In this manner, structures similar to gecko setae (bundled pillars) splitting into spatulae (exposed tips) may be formed. Such pillars can then be bonded to or embedded in a base, such as flexible member or end effector pad base, for example.

Additional methods of co-fabricating different hierarchical levels can including laser patterning, lithography, and imprinting using various materials. Flexible members similar to gecko lamellae can be manufactured by laser patterning of films; Lee et al., Langmuir 2009, 25(21), 12449-12453, incorporated by reference herein, disclose a method of forming a synthetic multilevel structure of nanofiber arrays on a lamella-like structure using high-density polyethylene (HDPE). Thickness, width and length of the lamella were 15 microns, 0.8 mm and 1.3 mm, respectively, with arrays of 600 nm diameter, 18 micron long nanofiber cofabricated on the lamella structure. The methods are extendable to other dimensions and materials.

Murphy et al. Applied Materials and Interfaces Vol. 1, No. 4, 849-855 2009, incorporated by reference herein, disclose methods of forming multilevel hierarchical structures having controlled tip-shape, including those having a broadened shape, similar to that of a gecko spatula. Base fibers having mushroom shaped tips are dipped into a liquid polymer and then placed onto an etched mold having the desired tip ends etched in negative. The liquid polymer on the base fibers is drawn into negative features of the mold and cured, with the mold etched away after curing. Carbon nanotubes may be embedded into the tips for fabrication of further levels.

In some implementations, flexible members may be formed from carbon microstructures. Daicho et al., Optical Materials Express, Vol. 3, Issue 6, pp. 875-883 (2013), incorporated by reference herein, describes techniques for fabrication of complex carbon microstructures including direct laser writing and microtransfer molding techniques. Wang et al., ACS Macro Lett. 2012, 1, 1176-1179, incorporated by reference herein describe techniques of forming microstructures from carbon nanotube networks, with the microstructures having tunable mechanical properties.

While the above techniques provided examples of methods of manufacture, other techniques as known in the art may also be used.

Figure 8:
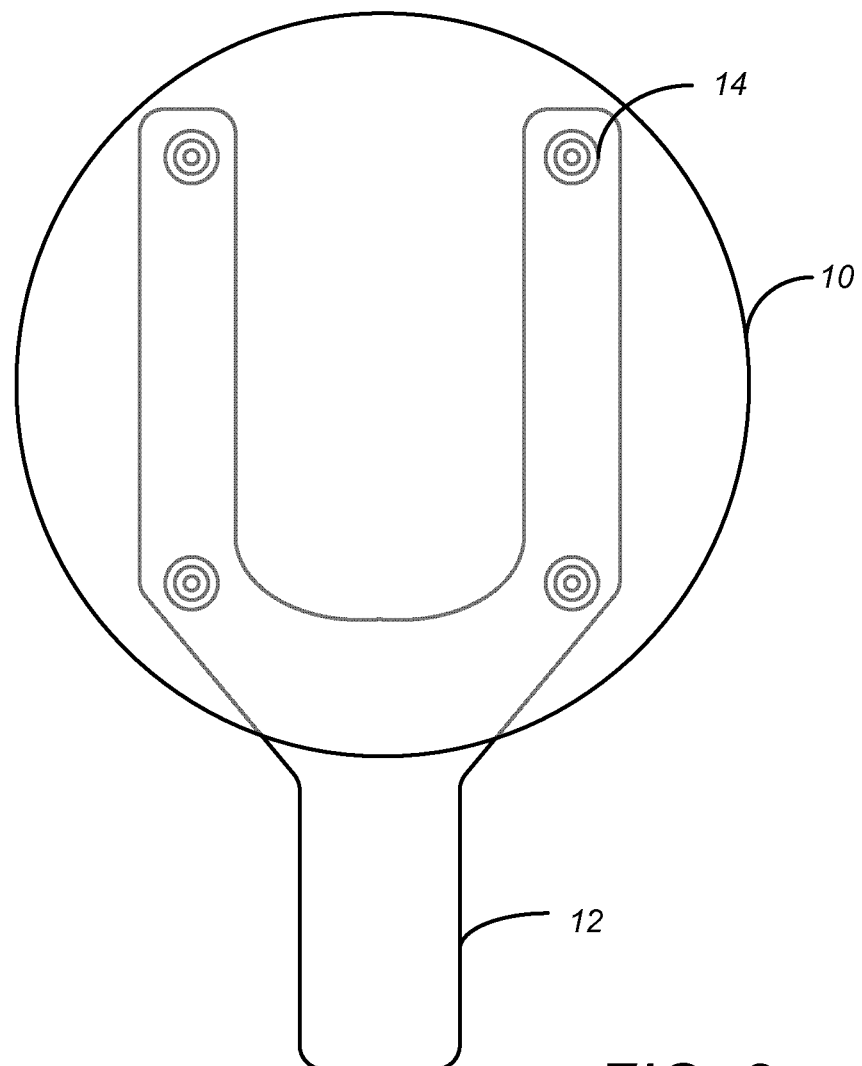
FIG. 8 shows an example of an end effector including four end effector contact pads including van der Waals-based microstructures.

Once formed, the pads may be attached to an end effector for use. FIG. 8 shows an example of an end effector 12 including four end effector contact pads 14. Circular zones are schematically represented on the end effector contact pads 14, though the zones would generally be too small to see on a macroscopic level. According to various implementations, the end effector contact pads 14 are removable and replaceable after a certain amount of usage time.

The number and size of the end effector contact pads 14 can depend on the substrate size as well as the desired maximum acceleration. In one example, a 100 nm wide tip of a contact member may have an attractive van der Waals force of 0.4 µN. Twenty-five million tips on a pad, or 6.25 million tips on each of four pads, would provide a total force of 10 N, or about 1 kg. This would provide an equivalent Cf of almost 3 for a 450 mm 0.342 kg semiconductor wafer.

Figure 9:
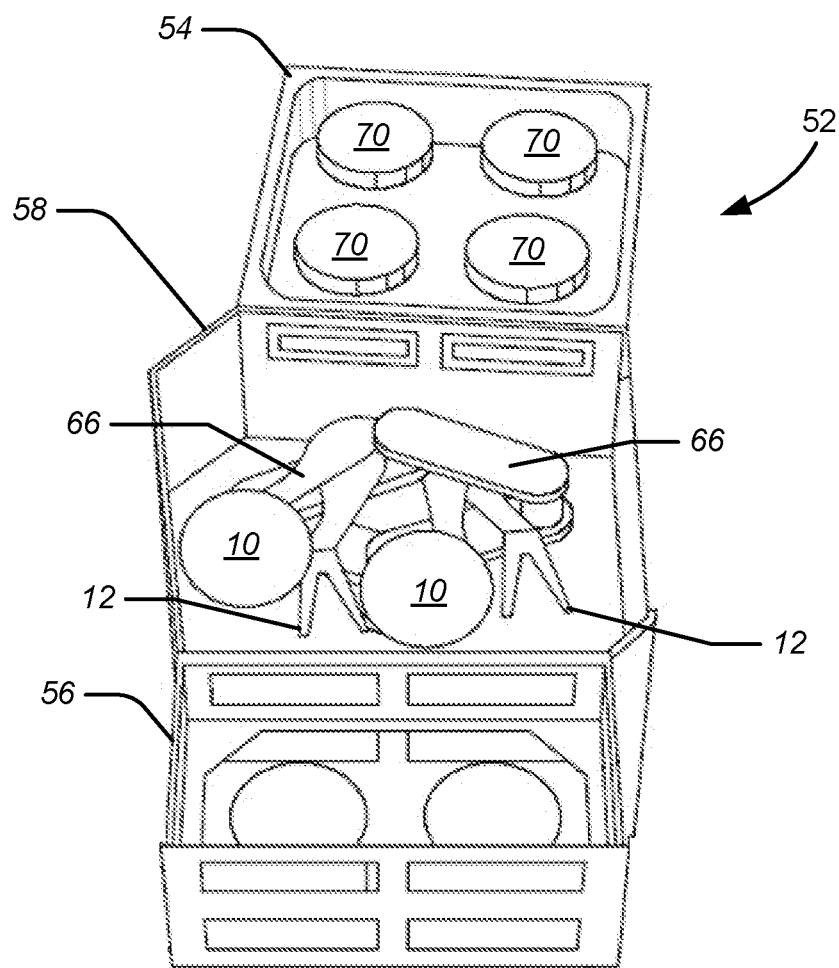
FIG. 9 shows an example of a semiconductor process tool including a high throughput vacuum transfer module having an end effector including van der Waals-based microstructures.

Provided also are high throughput vacuum transfer modules including van der Waals-based end effectors as described herein and semiconductor tools including high throughput vacuum transfer modules. FIG. 9 shows an example of a semiconductor process tool including a high throughput vacuum transfer module. The semiconductor process tool 52 shown in FIG. 9 may be used to process substrates, such as semiconductor wafers of any dimension including 300 mm diameter semiconductor wafers and 450 mm diameter semiconductor wafers. A vacuum transfer module 58 is connected to a load lock 56 and a process module 54. Although only one process module is depicted, according to various implementations, there may be any number of process modules connected to the vacuum transfer module 58. Examples of process modules can include deposition chambers, etching chambers, and the like. The vacuum transfer module 58 contains a vacuum transfer module (VTM) robot including dual robot arms 66 and dual van der Waals-based end effectors 12 attached to each of the robot arms 66. Two end effectors 12 are shown covered by semiconductor wafers 10. The process module 54 contains multiple wafer supports 70. The vacuum transfer module 58 in FIG. 9 is configured to transfer substrates between the load lock 56 and the process module 54. The load lock 56 may be connected to an atmospheric transfer module (not shown) including an atmospheric (ATM) robot, which in turn can be connected to wafer storage locations, such as one or more Front Opening Universal Pods (FOUPs). An example path of a wafer going from a FOUP to be processed in the process module 54 is given below:

1—ATM Robot FOUP Pick
2—ATM Robot Move to Load lock
3—ATM Robot Load Lock Place
4—Load Lock Pumpdown
5—VTM Robot Load Lock Pick
6—VTM Robot Move to Process Module 7—VTM Robot Process Module Place The path of a processed wafers going from the process module 54 to a FOUP is given in the example below:

1'—VTM Robot Process Module Pick
2'—VTM Robot Move to Load Lock
3'—VTM Robot Load Lock Place
4'—Load Lock Vent/Cool
5'—ATM Robot Load Lock Pick
6'—ATM Robot Move to FOUP
7'—ATM Robot FOUP Place The timing for each of the move steps 2, 2', 6, and 6' is limited by a maximum coefficient of friction. For example, maximum acceleration and deceleration may be limited to a value based on the coefficient of friction of the end effector, using a safety factor of 5, such that the maximum acceleration in the steps is no more than ⅕ the maximum allowable acceleration. While vacuum actuated end effectors can increase acceleration for the ATM robot steps 2 and 6', vacuum actuation cannot be used for the VTM robot of steps 2' and 6. The van der Waals-based end effectors disclosed herein enable significantly higher acceleration for these steps. Further, the van der Waals-based end effectors disclosed herein can enable high acceleration for the ATM robot steps 2 and 6' using a passive system with no actuation. In some implementations, an acceleration of at least 0.5 g, at least 1 g, at least 2 g, or at least 3 g may be used.

Figure 10:
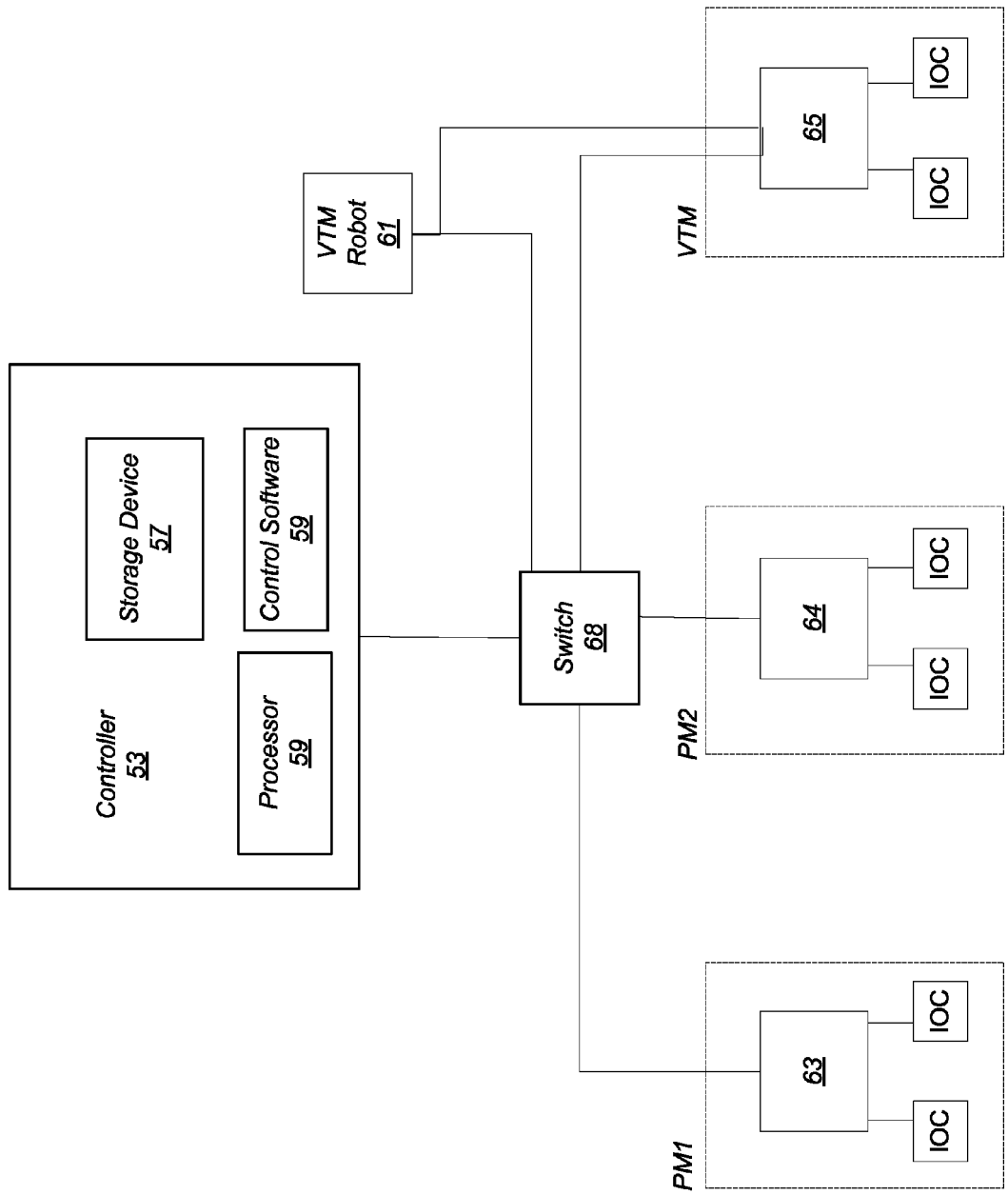
FIG. 10 shows block diagram of an example of a control system that may be employed to control a semiconductor process tool.

The semiconductor process tool 52 may also include a controller employed to control process conditions and hardware states of the semiconductor process tool 52. FIG. 10 shows block diagram of an example of a control system. It will be appreciated that other schemes and arrangements may be employed. In some embodiments, a controller 53 (which may include one or more physical or logical controllers) controls some or all of the operations of a process tool. Instructions for implementing appropriate control operations are executed on a processor. These instructions may be stored on the memory devices associated with the controller or they may be provided over a network. In certain embodiments, the controller executes system control software.

For example, a controller may the receipt of a wafer from outside the apparatus, picking and placing the wafer, and/or the transfer a wafer from one location to another. The controller 53 may include one or more one or more storage devices 57 and one or more processors 59. A processor 59 may include a CPU or computer, analog and/or digital input/output connections, stepper motor controller boards, etc.

In some embodiments, the controller 53 controls all of the activities of the vacuum transfer module 58. In some embodiments, the controller 53 is a system controller that controls all of the activities of processing tool 52. In some embodiments, the controller 53 executes machine-readable control software 59 stored in storage device 57 and executed on processor 59 so that the apparatus will perform a method in accordance with the present embodiments. Alternatively, the control logic may be hard coded in the controller. Applications Specific Integrated Circuits, Programmable Logic Devices (e.g., field-programmable gate arrays, or FPGAs) and the like may be used for these purposes. In the following discussion, wherever "software" is used, functionally comparable hard coded logic may be used in its place. The term "code" may refer to software or hard coded logic.

Control software 59 may include instructions for controlling the timing of pick and place moves, valve and door openings, robot movements including rotational movement, robot arm movements including vertical, theta (rotational), and x-y direction movements, robot arm acceleration and deceleration, substrate pedestal, chuck and/or susceptor position, and other parameters of a particular transfer process use of a semiconductor process tool. Control software may be configured in any suitable way. For example, various process tool component subroutines or control objects may be written to control operation of the process tool components for performing various process tool processes. Control software 59 may be coded in any suitable computer readable programming language.

In some embodiments, control software 59 may include input/output control (IOC) sequencing instructions for controlling the various parameters described above. For example, each phase of a transfer process may include one or more instructions for execution by the controller 53. Other computer software and/or programs stored on mass storage device 57 associated with the controller 53 may be employed in some embodiments. Examples of programs or sections of programs for this purpose include a substrate positioning program, a robot control program, a process module door or valve timing program and a load lock door or valve timing program.

In the example shown in FIG. 10, the controller 53 can send commands to process module controllers 63 and 64, which control process modules PM1 and PM2, a vacuum transfer module controller 65, and a vacuum transfer module robot 61 via switch 68. (Other parts of the semiconductor process tool that the process controller may control are not shown in this figure). There can be multiple input/output controllers (IOCs) in each module as indicated in FIG. 10 for connecting to the individual valves, sensors, etc. in each module. The controllers can be physically located at various points in the apparatus; e.g., within the module or at a distance away from the module. The vacuum transfer robot 61 may receive direct commands from the vacuum transfer controller 65 instead of or in addition to the controller 53.

A substrate positioning program may include program code for moving a substrate along a nominal path, detecting substrate position, and correcting substrate position based on the detected substrate position.

A robot control program may include program code for moving a robot and robot arm in the z-direction, x-y-direction, and theta direction along one or more nominal paths. The robot control program may include code for appropriately starting and stopping one or more robot motors, and for controlling the acceleration and deceleration of the robot arm. The robot control program may include code for picking and placing a substrate at various locations. A process module or load lock door or valve timing program may include program code for opening and closing a door or valve to allow access by the robot.

In some embodiments, there may be a user interface associated with the controller 53. The user interface may include a display screen, graphical software displays of the apparatus and/or process conditions, and user input devices such as pointing devices, keyboards, touch screens, microphones, etc.

Signals for monitoring may be provided by analog and/or digital input connections of system controller 53 from various process tool sensors. The signals for controlling the process may be output on the analog and digital output connections of processing tool 52. Non-limiting examples of process tool sensors that may be monitored include substrate position detectors, thermocouples, robot motor torque sensors, etc. Appropriately programmed feedback and control algorithms may be used with data from these sensors to maintain conditions.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/ processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper. A robot such as that described herein may be used to move a substrate from one tool to another, thus facilitating fabrication processes.

It will be understood that unless features in any of the particular described implementations are expressly identified as incompatible with one another or the surrounding context implies that they are mutually exclusive and not readily combinable in a complementary and/or supportive sense, the totality of this disclosure contemplates and envisions that specific features of those complementary implementations can be selectively combined to provide one or more comprehensive, but slightly different, technical solutions. It will therefore be further appreciated that the above description has been given by way of example only and that modifications in detail may be made within the scope of the invention.

What is claimed is:

1. A contact pad for an end effector, comprising:
   a contact pad base; and
   a plurality of structures arrayed on the contact pad base, each structure including a flexible member and a plurality of contact members connected to the flexible member, the flexible member configured to deflect on application of a substrate, and the plurality of contact members configured to adhere to a substrate by van der Waals adhesion, wherein the plurality of structures are arranged in a plurality of circumferential zones around the center of the contact pad base configured such that release of a substrate from the contact pad is staged by zone.

2. The contact pad of claim 1, wherein the plurality of structures are in circumferential rows extending around the center of the contact pad base.

3. The contact pad of claim 1, wherein each of the plurality of structures has an altitude, and wherein the altitudes of the plurality of structures vary across the contact pad.

4. The contact pad of claim 3, wherein the variance in altitude has circular symmetry.

5. The contact pad of claim 1, wherein each of the plurality of structures has an effective spring constant, and wherein the effective spring constants of the plurality of structures vary across the contact pad.

6. The contact pad of claim 5, wherein the variance in effective spring constant has circular symmetry.

7. The contact pad of claim 1, wherein the flexible members are micron-scale structures.

8. The contact pad of claim 1, wherein each contact member comprises a base split into a plurality of free ends.

9. The contact pad of claim 1, wherein the flexible members comprise carbon microstructures.

10. The contact pad of claim 1, wherein the flexible members comprise carbon nanotube networks.

11. The contact pad of claim 1, wherein the largest dimension of a flexible member is less than 1 mm.

12. The contact pad of claim 1, wherein the smallest dimension of a flexible member is less than 100 microns.

13. The contact pad of claim 1, wherein the smallest dimension of a contact member is less than 1 micron.

14. The contact pad of claim 1, wherein the smallest dimension of a contact member is less than 500 nanometers.

15. The contact pad of claim 1, wherein the flexible members comprise a polymer.

16. A contact pad for an end effector, comprising:
   a contact pad base; and
   a plurality of structures arrayed on the contact pad base, wherein each of the plurality of structures has an effective spring constant and an altitude, and wherein at least one of the effective spring constant and the altitude of the plurality of structures varies across the contact pad, wherein the variance in altitude or effective spring constant has circular symmetry.

17. The contact pad of claim 16, wherein the variance in altitude or effective spring constant has circular symmetry around the center of the contact pad base.

18. A robot comprising:
   one or more arms;
   a motor configured to move the one or more arms; and
   one or more end effectors configured to attach to the one or more arms, wherein the one or more end effectors are configured to transfer a semiconductor substrate by passive contact at an acceleration of at least about 0.5 g in the x-y direction without slipping and configured for non-actuated release of the semiconductor substrate on application of a normal force without tilting the semiconductor substrate, wherein the one or more end effectors each comprise a contact pad base and a plurality of structures arrayed on the contact pad base, each structure including a flexible member and a plurality of contact members connected to the flexible member, the flexible member configured to deflect on application of a substrate; and the plurality of contact members configured to adhere to a substrate by van der Waals adhesion, wherein the plurality of structures are arranged in a plurality of circumferential zones around the center of the contact pad base configured such that release of a semiconductor substrate from the contact pad base is staged by zone.

19. The robot of claim 18, wherein the one or more end effectors are operable to support semiconductor substrates at temperatures above 400° C.

* * * * *